United States Patent
Kang et al.

(10) Patent No.: US 8,987,164 B2
(45) Date of Patent: Mar. 24, 2015

(54) SEMICONDUCTOR PHOTOCATALYST COATED WITH GRAPHITIC CARBON FILM AND METHOD OF FABRICATING THE SAME

(71) Applicant: Korea Advanced Institute of Science and Technology, Daejeon (KR)

(72) Inventors: Jeung-Ku Kang, Daejeon (KR); Dong-Ki Lee, Daejeon (KR); Kyu-Sung Han, Daejeon (KR); Weon-Ho Shin, Daejeon (KR); Jung-Woo Lee, Daejeon (KR); Jung-Hoon Choi, Daejeon (KR); Kyung-Min Choi, Daejeon (KR); Yeob Lee, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 122 days.

(21) Appl. No.: 13/708,813

(22) Filed: Dec. 7, 2012

(65) Prior Publication Data
US 2014/0021589 A1    Jan. 23, 2014

(30) Foreign Application Priority Data
Jul. 19, 2012    (KR) .................. 10-2012-0078747

(51) Int. Cl.
| | |
|---|---|
| *B01J 21/18* | (2006.01) |
| *B01J 23/00* | (2006.01) |
| *H01B 1/02* | (2006.01) |
| *H01B 1/06* | (2006.01) |
| *H05B 7/085* | (2006.01) |

(Continued)

(52) U.S. Cl.
CPC ........ *H01L 21/0228* (2013.01); *H01L 29/0603* (2013.01); *H01L 51/0045* (2013.01); *Y10S 977/811* (2013.01); *Y10S 977/823* (2013.01); *Y10S 977/90* (2013.01)
USPC ........ 502/182; 502/350; 252/507; 252/520.2; 977/811; 977/823; 977/900

(58) Field of Classification Search
USPC .................. 502/182, 350; 977/811, 823, 900; 252/507, 520.2
IPC ................................. B01J 21/06,21/18
See application file for complete search history.

(56) References Cited

U.S. PATENT DOCUMENTS

| | | | | |
|---|---|---|---|---|
| 2005/0208304 | A1* | 9/2005 | Collier et al. .................. | 428/403 |
| 2010/0330423 | A1* | 12/2010 | Cui et al. ...................... | 429/220 |

(Continued)

OTHER PUBLICATIONS

"Efficient TiO2 Photocatalysts from Surface Hybridization of TiO2 Particles with Graphite-like Carbon," Li-Wu Zhang et al. Advanced Functional Materials, 2008, 18, pp. 2180-2189.*

(Continued)

*Primary Examiner* — Patricia L Hailey
(74) *Attorney, Agent, or Firm* — Sterne, Kessler, Goldstein & Fox, P.L.L.C.

(57) ABSTRACT

A semiconductor of which a substance such as a semiconductor photocatalyst is uniformly coated on the surface thereof with a graphitic carbon film and a method of fabricating the same are disclosed. According to the inventive method, a graphitic carbon film having a thickness of 1 nm or less is uniformly formed on the surface of the semiconductor by performing hydrothermal synthesis and pyrolysis on glucose, so as to keep the original structure crystallinity of the semiconductor photocatalyst to be a support of the carbon film.

6 Claims, 4 Drawing Sheets

(51) Int. Cl.
*H01L 21/02* (2006.01)
*H01L 29/06* (2006.01)
*H01L 51/00* (2006.01)

(56) References Cited

U.S. PATENT DOCUMENTS

2012/0094825 A1* 4/2012 Hattori et al. .......... 502/182
2012/0251887 A1* 10/2012 Han .......... 429/231.5

OTHER PUBLICATIONS

"Carbon nanotube/titania composites prepared by a micro-emulsion method exhibiting improved photocatalytic activity," Youji Li et al. Applied Catalysis A: General 427-428 (2012), pp. 1-7.*

"Electrochemical properties of carbon-coated TiO2 nanotubes as a lithium battery anode material," Kun-Young Kang et al. Materials Chemistry and Physics 137 (2012), pp. 169-176.*

"Preparation of carbon coated TiO2 nanotubes film and its catalytic application for H2 generation," Fangzhou Jia et al. Catalysis Communications 12 (2011), pp. 497-501.*

Lee, D. K.., et al., "Graphitic Domain Layered Titania Nanotube Arrays for Separation and Shuttling of Solar-Driven Electrons," *Journal of Materials Chemistry A 1*: 203-207, The Royal Society of Chemistry, England (published online Oct. 2012).

Electronic Supplementary Material for *Journal of Materials Chemistry A*, Lee, D. K., et al., "Graphitic Domain Layered Titania Nanotube Arrays for Separation and Shuttling of Solar-Driven Electrons," The Royal Society of Chemistry, England (published online Oct. 2012).

* cited by examiner

SEMICONDUCTOR PHOTOCATALYST COATED WITH GRAPHITIC CARBON FILM AND METHOD OF FABRICATING THE SAME

CROSS REFERENCE TO RELATED APPLICATIONS

This application claims priority to Korean Patent Application No. 10-2012-0078747, filed on Jul. 19, 2012 in the Korean Intellectual Property Office, the entire disclosure of which is incorporated herein by reference.

BACKGROUND OF THE INVENTION

1. Field of the Invention

The present invention relates to a method of fabricating a graphitic carbon film on the surface of a semiconductor and a semiconductor photocatalyst fabricated by the same. In more detail, the present invention relates to a semiconductor of which a substance such as a semiconductor photocatalyst, which has important electrochemical properties, is coated on the surface thereof with a graphitic carbon film having a thickness of 1 nm or less, so as to ensure attenuated electron-hole recombination while keeping the original structure and properties of the semiconductor substance, and a method of fabricating the same.

2. Background Art

Toxic substances (carbon dioxide and nitrogen dioxide, etc.) generated from fossil fuels are the chief culprits in environmental pollution and it is necessary to develop sustainable clean energy sources, with the coming effectuation of the Kyoto protocol which limits the carbon dioxide emission. Using a high-efficiency semiconductor photocatalyst is noted for the fact that it is possible to not only produce an energy source with high energy density, such as hydrogen or methane, from water, but also reuse the water that is a byproduct when using a fuel cell, as a source.

The semiconductor photocatalysts represented by titanium dioxide ($TiO_2$) are used in various fields, for the advantages of chemical stability, low manufacturing cost, and easy storage and distribution, in comparison to organic photocatalysts. The existing semiconductor photocatalysts, however, have a problem in that the photoconversion efficiency is low because electron-hole recombination is frequently generated by various defects in semiconductor substances. It is necessary to improve the problem because only a small amount of photoelectrons generated by light due to the electron-hole recombination, which is a feature of the semiconductors, is used to reduce protons in the external system.

The electron-hole recombination is mainly generated, as the flow of electrons is blocked at the grain boundary created by different atomic arrangement in a polycrystalline substance and at atom vacancies due to non-uniform atomic arrangement. It is necessary to make a high-purity single-crystal semiconductor or form a substance smaller than the electron diffusion length in order to prevent the electron-hole recombination. However, the conditions for forming a semiconductor substance with a high-purity single crystal are very strict and the forming process is complicated, so that it is difficult to use the substance for industrial purposes. In addition, a substance formed with a dimension of several nanometers, which is smaller than the electron diffusion length, has high surface energy, and thereby often exhibit an agglomeration phenomenon, thus this is not considered as an effective solution.

Recently, a study for solving the problem of electron-hole recombination by attaching a substance having high electric conductivity and large capacity to a semiconductor photocatalyst such that the electrons generated from the semiconductor flow to the attached substance has been reported. In particular, graphitic allotropes of carbon represented by fullerenes, CNTs (Carbon Nanotubes), and graphene have been noted because of the abundance of the raw materials and high chemical stability, as well as excellent electrical properties. A study has been reported that when the flow of semiconductor photoelectrons is outwardly induced by binding graphitic allotropes of carbon (fullerenes, CNTs, and graphene) having high electric conductivity and large capacity, the electron-hole recombination phenomenon is reduced and the photoconversion efficiency is increased.

The substances have a problem, however, in that they cannot be applied to semiconductor substances having a complicated structure because the manufacturing method and the forming conditions are restrictive. Therefore, the present invention has been made to provide a method of directly forming a graphitic carbon film on a semiconductor surface having a complicated structure.

BRIEF SUMMARY OF THE INVENTION

Accordingly, it is an object of the present invention to provide a method of directly forming a thin graphitic carbon film on a non-uniform surface of a semiconductor, and as semiconductor photocatalyst fabricated by the same.

The technical subject to be implemented in the present invention are not limited to the technical problems described above and other technical subjects that are not stated herein will be clearly understood by those skilled in the art from the following specifications.

In order to accomplish the above purpose, there is provided a method of fabricating a semiconductor coated with a carbon film, which includes: a first step of preparing a semiconductor photocatalyst to be coated with a carbon film; a second step of introducing the semiconductor photocatalyst into an aqueous solution and heat treating to form a gel type glucose onto the surface of the semiconductor; and a third step of heat treating the resultant of the second step to form the semiconductor photocatalyst coated with the carbon film.

Preferably, in the first step, titanium dioxide ($TiO_2$) nanotubes are formed by an electro-metallurgical process and the titanium dioxide nanotubes are heat treated to change the phase thereof into an anatase crystalline structure.

Preferably, in the second step, heat treatment is performed at 160° C. to 180° C. or 4 to 5 hours in a vacuum oven.

Preferably, in the third step, heat treatment is performed at 650° C. to 750° C. for 3 hours under an argon atmosphere with a CVD (Chemical Vapor Deposition) device.

Preferably, the semiconductor of which the glucose is formed on the surface thereof as the resultant of the second step is dried at 60° C. to 70° C. for 12 or 24 hours in a vacuum oven to remove the water remaining in the glucose.

According to the present invention, there is also provided an semiconductor photocatalyst coated with $_4$ carbon film, which includes: a nanotuhe layer formed by titanium dioxide ($TiO_2$) nanotubes having an anatase crystalline structure; and a carbon film formed on the titanium dioxide nanotubes, wherein the carbon film is formed by hydrothermally-synthesizing glucose, removing the water remaining in the glucose, and heat treating.

Preferably, the carbon film has a graphitic: structure of two layers or four layers.

According to the semiconductor photocatalyst coated with a graphitic carbon film of the present invention, a graphitic carbon film having a thickness of 1 nm or less is uniformly bound to the surface of a semiconductor substance. Therefore, the photoelectrons generated from the semiconductor catalyst can often flow to the outside thereof through a bound conductive carbon film without recombining with the holes in the substance, thereby increasing the photoconversion efficiency of the photocatalyst.

BRIEF DESCRIPTION OF THE FIGURES

The above and other objects, features and other advantages of the present invention will be more clearly understood from the following detailed description taken in conjunction with the accompanying drawings, in which.

DETAILED DESCRIPTION OF THE INVENTION

An embodiment of the present invention provides a method of fabricating a semiconductor coated with a carbon film which includes a first step of preparing a semiconductor to be coated with a carbon film, a second step of introducing the semiconductor into an aqueous solution and heat treating to form a. gel type glucose onto the surface of the semiconductor, and a third step of heat treating the resultant of the second step to form the semiconductor coated with the carbon film.

Figure 1:
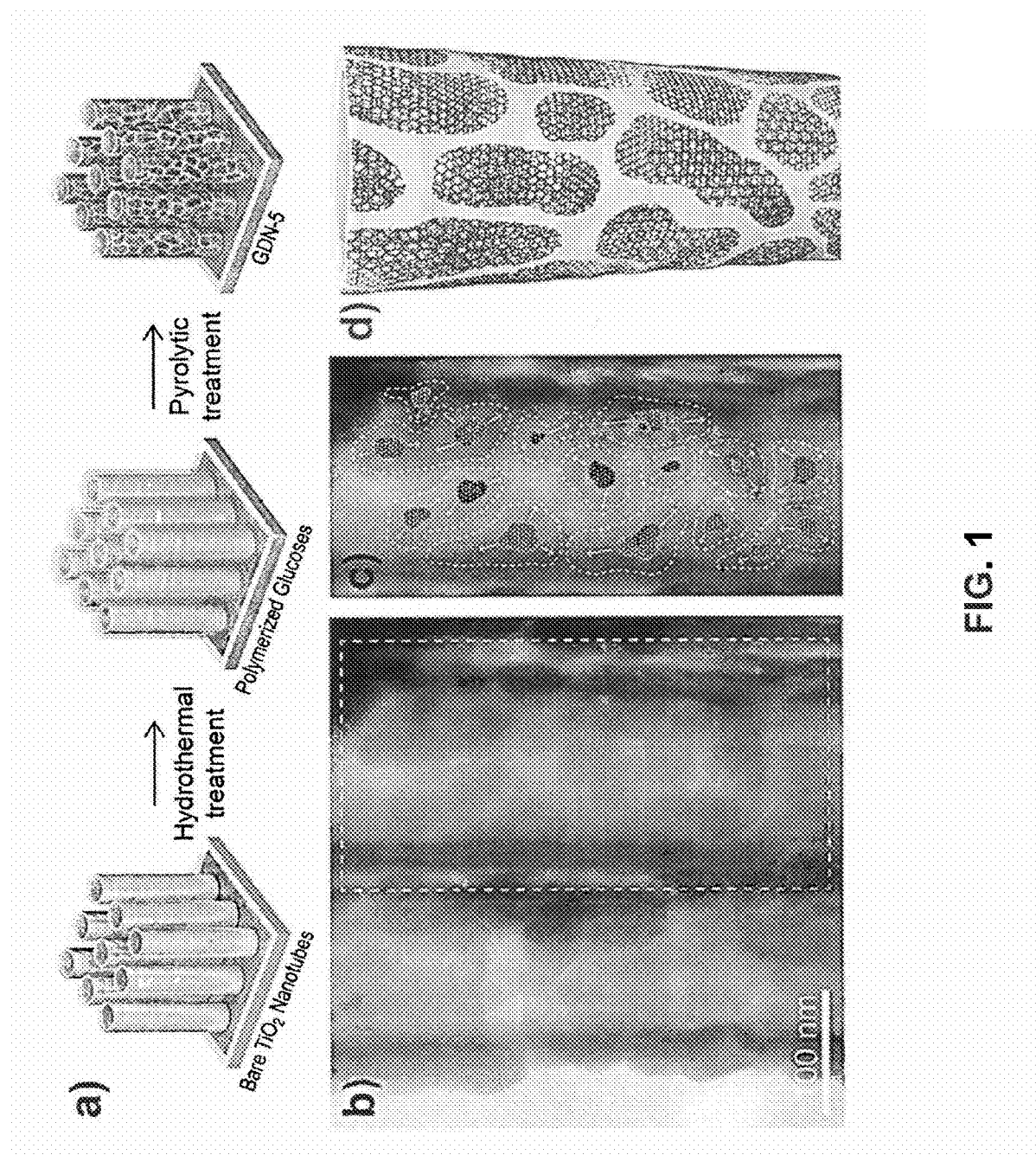
FIG. 1 is a diagram schematically showing a process of fabricating a semiconductor photocatalyst coated with a graphitic carbon film according to an embodiment of the present invention.

FIG. 1 is a schematic diagram showing the synthesizing and growing process of a semiconductor photocatalyst coated with a graphitic carbon film. First, it is necessary to prepare a semiconductor to be coated with a carbon film, but the present invention is not limited thereto. In the present embodiment, the nanotube arrangement of the titanium dioxide ($TiO_2$) that is a semiconductor photocatalyst is grown on a titanium substrate by an electro-metallurgical process. The detailed fabricating method of the titanium dioxide ($TiO_2$) nanotubes according to the embodiment of the present invention is as follows. A titanium substrate having a thickness of 1.127 nm is ultrasonically cleaned with acetone, ethanol, and distilled water, then the titanium substrate is positioned at a dual type anode electrode and nickel (Ni) metal is positioned at the opposite cathode electrode. The electrodes are disposed in an ethylene glycol solution where ammonium fluoride of 0.25 wt % is dissolved and a direct current of 60 V is applied for 3 hours and 30 minutes. The growing conditions of the nanotubes described above are just preferable conditions of the present embodiment and titanium dioxide ($TiO_2$) nanotubes may be grown under different growing conditions, so that it is apparent that the scope of the present invention is not particularly limited to the conditions described above.

The grown titanium dioxide ($TiO_2$) nanotubes are heat treated to change the phase thereof into an anatase crystalline structure that is advantageous for photoconversion. With the method of heat treating the grown titanium dioxide ($TiO_2$) nanotubes to change the phase thereof into an anatase crystalline structure, the titanium dioxide ($TiO_2$) nanotubes are ultrasonically cleaned with acetone and 2-propanol solutions, then heat treated at 650° C. for 1 hour under an air atmosphere, such that a nanotube arrangement of the titanium dioxide ($TiO_2$) having an anatase phase can be achieved. The growing conditions of the nanotubes described above are just preferable Conditions of the present embodiment and the phase of the titanium dioxide ($TiO_2$) nanotubes may he changed under different growing conditions, so that it is apparent that the scope of the present invention is not limited to the conditions described above.

An arrangement of the titanium dioxide ($TiO_2$) nanotubes having an anatase crystalline structure and a glucose aqueous solution are simultaneously introduced into a pressure vessel and heat treated, thereby a gel type macromolecular glucose is formed on the surface of the titanium dioxide ($TiO_2$) nanotubes. Thereafter, the nanotubes are pyrolysised through prolonged heat treatment under an argon atmosphere in CVD (Chemical Vapor Deposition) equipment to grow a graphitic carbon film on the surface of the titanium dioxide ($TiO_2$) nanotubes, as shown in FIG. 1c. After the heat treatment is complete, a graphitic carbon film is formed on the surface of the titanium dioxide ($TiO_2$) nanotubes, as shown in FIG. 1d. Describing in more detail the method of growing a graphitic carbon film on a surface of the titanium dioxide ($TiO_2$) nanotubes having the crystalline structure of the present embodiment, the substrate of the titanium dioxide ($TiO_2$) nanotubes manufactured as described above and glucose of 50 mmol are simultaneously introduced into distilled water and moved into a steel pressure vessel. A graphitic carbon film is grown on the surface of the titanium dioxide ($TiO_2$) nanotubes by heat treating at 180° C. for 5 hours in a vacuum oven. The vessel is naturally cooled at room temperature for one day or more and then the substrate of the titanium dioxide ($TiO_2$) nanotubes is cleaned several times with flowing water and ethanol. The substrate is dried in a vacuum oven at 60° C. for one day (24 hours) or more to remove the water remaining in the hydrothermal-synthesized gel type glucose. Thereafter, the substrate is introduced into the CVD equipment and heat treated at 650° C. for 3 hours under an argon atmosphere, thereby completing fabrication of a graphitic carbon film having a thickness of 1 nm or less. The fabricating conditions of the graphitic carbon film of nanotubes described above are just preferable conditions of the embodiment and the graphitic carbon film may be grown under different growing conditions, so that it is apparent that the scope of the present invention is not limited to the conditions described above.

After the heat treatment is complete, the thin graphitic carbon film shown in FIG. 1d is achieved. FIG. 1b is a diagram obtained by observing the surface of the nanotubes of the semiconductor photocatalyst coated with the graphitic carbon film manufactured by the method described above, by STEM (Scanning Transmission Electron Microscopy). Referring to FIG. 1b, it can be seen whether there is a carbon film observed by a monochrome light and darkness difference.

The embodiment of the present invention provides a semiconductor photocatalyst coated with a carbon film, which includes a nanotube layer formed by titanium dioxide (TiO$_2$) nanotubes having an anatase crystalline structure and a carbon film formed on the titanium oxide nanotubes, wherein the carbon film is formed by hythothermally-synthesizing glucose, removing the water remaining in the glucose, and heat treating. Further, the embodiment of the present invention provides a semiconductor photocatalyst coated with a carbon film in which the carbon film has a two layers or four layers of graphitic structure.

Figure 2:
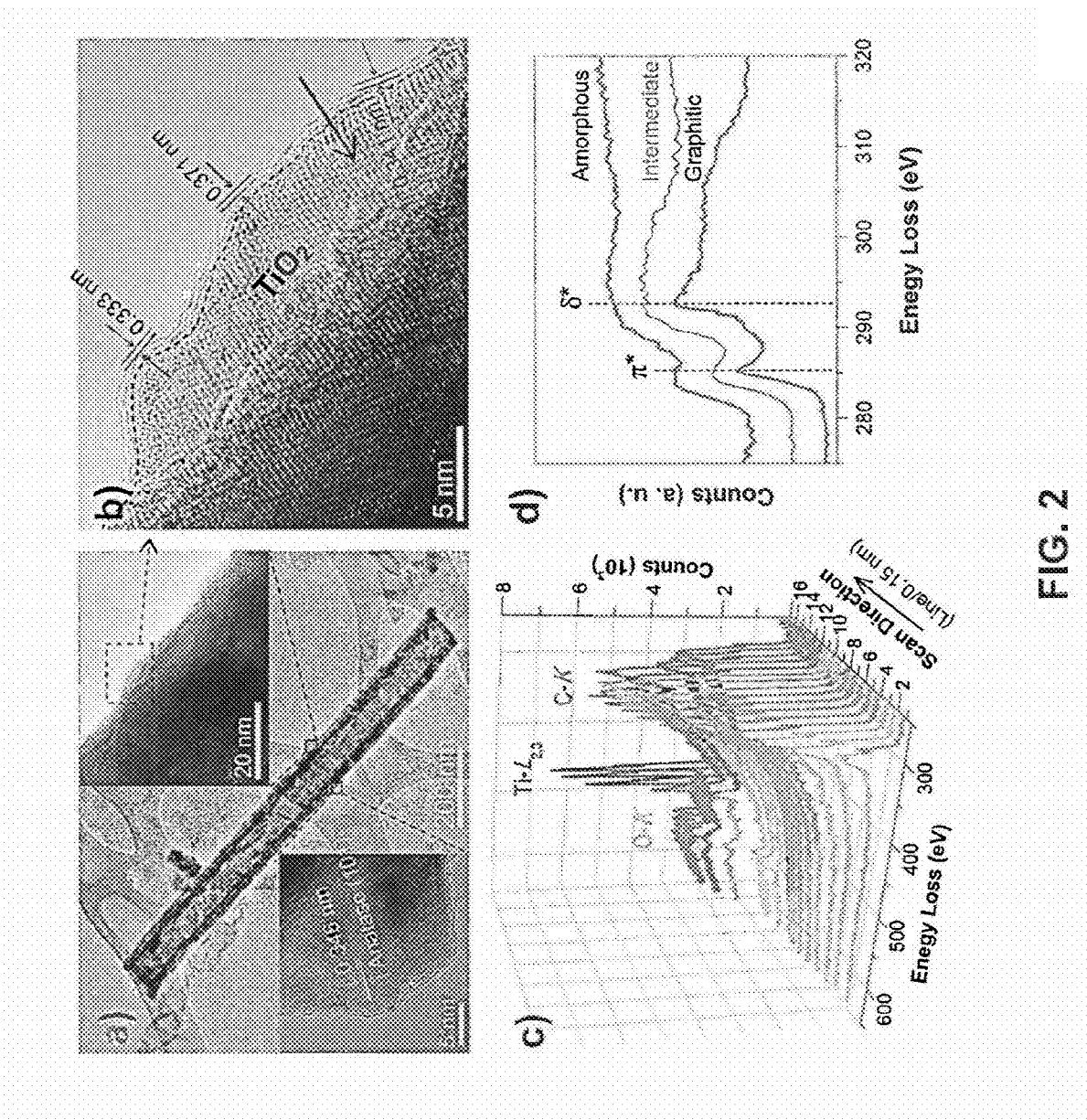
FIG. 2a is a TEM (Transmission Electron Microscopy) picture of a strand of nanotubes of the substances manufactured by the method shown in FIG. 1.
FIG. 2b is an enlarged picture of the upper right portion of FIG. 2a, FIG. 2c is a graph showing a result that the portion indicated by an arrow in FIG. 2b is measured by EELS (Electron Energy Loss Spectroscopy)
FIG. 2d is an enlarged diagram of the line No. 8 in the graph shown in FIG. 2c.

FIG. 2a is a TEM (Transmission Electron Microscopy) picture of a strand of nanotubes in the substance manufactured by the method described above. It was seen that the nanotubes at the left lower portion form a substance having the same surface gap as that of the crystalline structure of anatase 101. FIG. 2b is a picture enlarging the right upper portion of that shown in FIG. 2a. It can be seen that carbon films having surface gaps (0.333, 0.341, 0.371 nm) the same as those of the graphitic carbons are uniformly bound in two to four layers on the surface of the titanium dioxide (TiO$_2$). FIG. 2c is a graph showing a result of measuring the portion indicated by the arrow in FIG. 2b by EELS (Electron. Energy Loss Spectroscopy) and FIG. 2d is an enlarged diagram showing the line No. 8 in the graph shown in FIG. 2c. It can be seen that a pi-antibonding ($\pi^*$) peak corresponding to remarkable 285 eV, a sigma-antibonding ($\sigma^*$) peak corresponding to 292 eV, and a carbon film where a schematic shape of the graph is similar to that of the graphitic structure.

Figure 3:
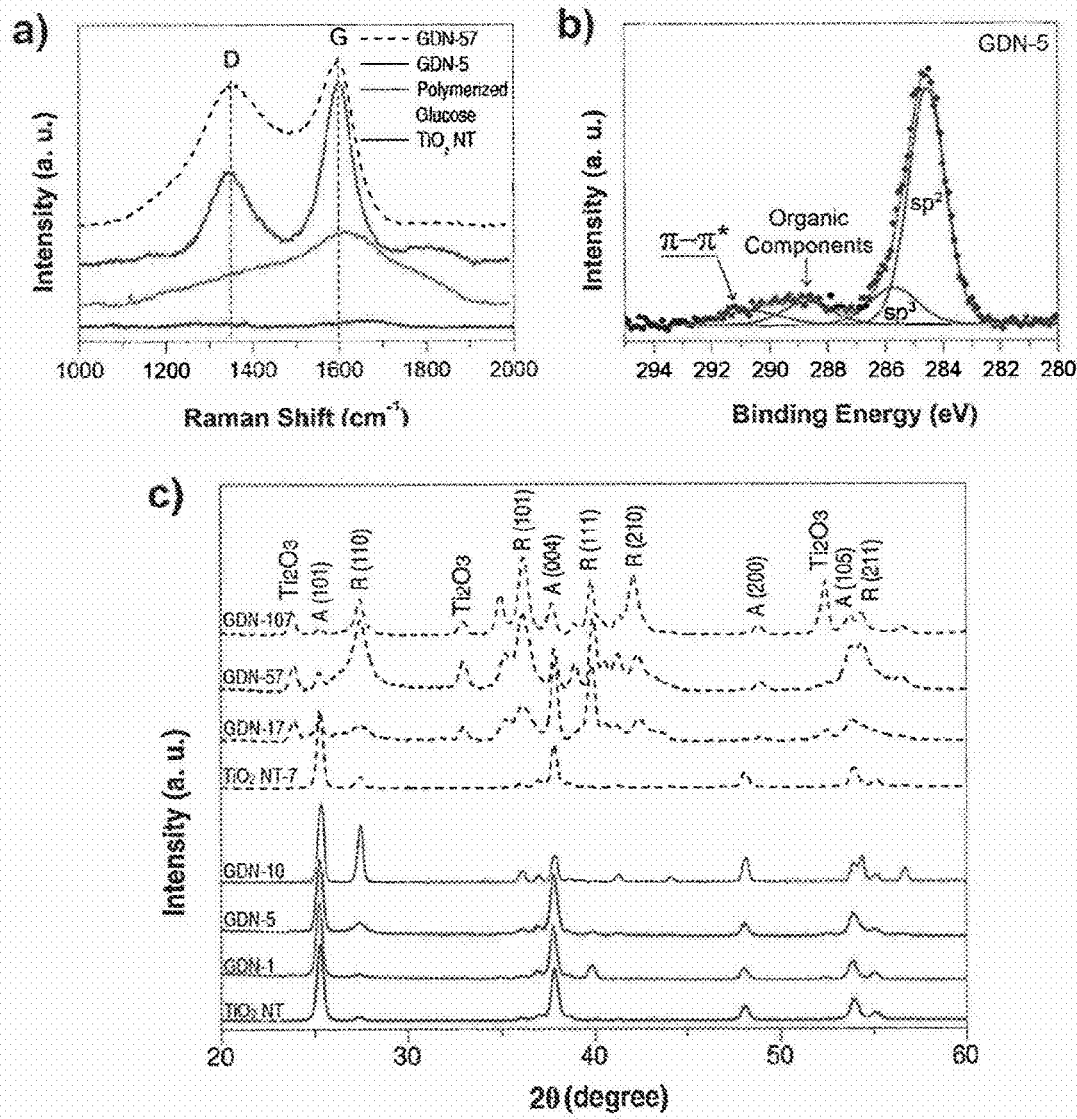
FIG. 3a is a Raman analysis graph when a $TiO_2$ nanotube, GDN-5, and hydrothermal-synthesized gel type glucose which are substances before ($TiO_2$ nanotube), after (GDN-5), and during forming a carbon film are coated.
FIG. 3b is a result of carbon 1s XPS (X-ray Photoelectron Spectroscopy) of the substances shown in FIG. 3a, and FIG. 3c is a diagram showing a result of XRD (X-ray Diffraction Spectroscopy)

FIG. 3a is a Raman analysis graph when TiO$_2$ nanotubes, GDN-5), and a hydrothermal-synthesized gel type glucose, which are substances before, after, and during forming a carbon film, are coated. It can be seen that the structure is similar to graphite from the high G-band peak of the formed carbon film and the low D-band-to-G-band ratio ($I_D/I_G$) (0.56). FIG. 3b is the result of carbon 1s XPS (X-ray Photoelectron Spectroscopy) of the substances. It can be seen that the structure is the same as that of graphite from the high sp$^2$ binding peak and the pi-antibonding pi-phase difference ($\pi$-$\pi^*$ satellite) at the position of 290.7 eV. FIG. 3c is a diagram showing the result of XRD (X-ray Diffraction Spectroscopy), from which it can be seen that the anatase crystalline structures of TiO$_2$ nanotubes and GDN-5 remains the same before and after forming a carbon film, respectively.

Figure 4:
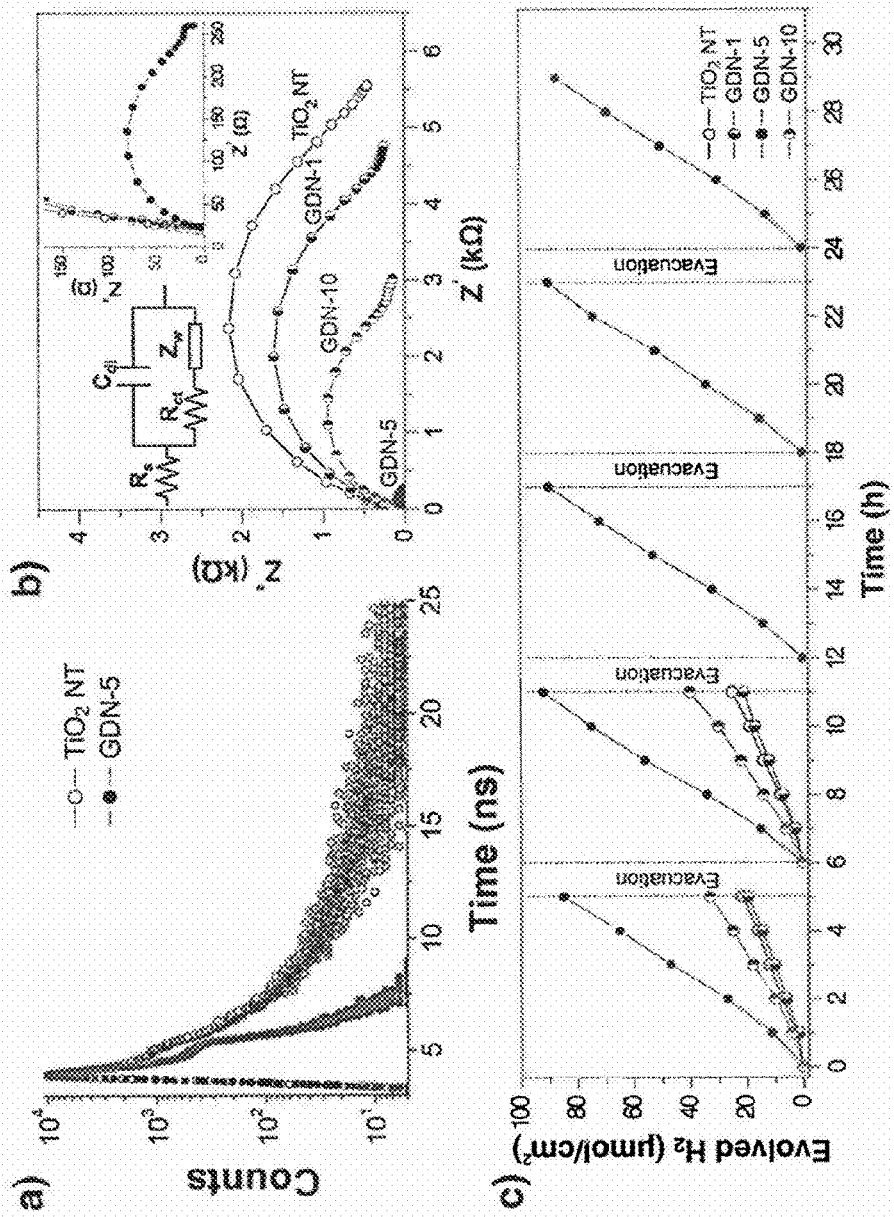
FIG. 4a is a result of TCSPC (Time-Correlated Single-Photon Counting)
FIG. 4b is a result of EIS (Electrochemical Impedance Spectroscopy)
FIG. 4c is a diagram showing a result that hydrogen is actually generated in water.

FIG. 4a is the result of TCSPC (Time-Correlated Single-Photon Counting), which shows that the lifetime of electrons decreases, from 3.36 ns to 1.89 ns, through separating of photo-excited electrons from holes by the graphitic carbon film (GDN-5) bound on the surface. Further, FIG. 4b is the result of EIS (Electrochemical Impedance Spectroscopy), in which it can be seen that the charge transfer resistance between electrolytes inside and outside the semiconductor decreases by about 1/24 times, from 5434Ω to 226Ω, through the graphitic carbon film (GDN-5). It can be seen that the graphitic carbon film uniformly formed on the semiconductor surface is effective in attracting the electrons created in the semiconductor and transmitting the electrons to the outside, from the results. FIG. 4c is a diagram showing a result that hydrogen is actually generated in water, which supports the above description.

The terms and words used in the present specification and claims should not be interpreted as being limited to typical meanings or dictionary definitions, but should be interpreted as having meanings and concepts relevant to the technical scope of the present invention. Therefore, the configurations described in the embodiments and drawings of the present invention are merely most preferable embodiments but do not represent all of the technical spirit of the present invention. Thus, the present invention should be construed as including all the changes, equivalents, and substitutions included in the spirit and scope of the present invention at the time of filing this application.

What is claimed is:

1. A method of fabricating a semiconductor photocatalyst coated with a plurality of carbon films, comprising:
    a first step of preparing a semiconductor photocatalyst to be coated with a plurality of carbon films;
    a second step of introducing the semiconductor photocatalyst into a glucose aqueous solution and heat treating to form a gel phase containing glucose onto a surface of the semiconductor photocatalyst; and
    a third step of heat treating the resultant of the second step to form the semiconductor photocatalyst coated with the plurality of carbon films,
    wherein the semiconductor photocatalyst with the gel phase containing glucose formed thereof is dried at 60° C. to 70° C. for 12 or 24 hours in a vacuum oven to remove water remaining in the glucose, and
    wherein the plurality of carbon films spaced apart from each other are coated on the surface of the semiconductor photocatalyst.

2. The method of claim 1, wherein, in the first step, titanium dioxide (TiO$_2$) nanotubes are formed by an electro-metallurgical process and the titanium dioxide nanotubes are heat treated to change the phase thereof into an anatase crystalline structure.

3. The method of claim 1, wherein, in the second step, heat treatment is performed at 160° C. to 180° C. for 4 to 5 hours in a vacuum oven.

4. The method of claim 1, wherein, in the third step, heat treatment is performed at 650° C. to 750° C. for 3 hours under an argon atmosphere with a CVD (Chemical Vapor Deposition) device.

5. A semiconductor photocatalyst coated with a plurality of carbon films, comprising:
    a nanotube layer formed by titanium dioxide (TiO$_2$) nanotubes having an anatase crystalline structure; and
    a plurality of carbon films spaced apart from each other on the titanium dioxide nanotubes,
    wherein the plurality of carbon films are formed by hydrothermally-synthesizing glucose, drying at 60° C. to 70° C. for 12 or 24 hours in a vacuum oven to remove the water remaining in the glucose, and heat treating.

6. The photocatalyst of claim 5, wherein the carbon film has a graphitic structure of two layers or four layers.

* * * * *